US006114735A

United States Patent [19]

Batra et al.

[11] Patent Number: 6,114,735

[45] Date of Patent: Sep. 5, 2000

[54] FIELD EFFECT TRANSISTORS AND METHOD OF FORMING FIELD EFFECT TRANSISTORS

[75] Inventors: Shubneesh Batra; Gurtej S. Sandhu, both of Boise, Id.

[73] Assignee: Micron Technology, Inc., Boise, Id.

[21] Appl. No.: 09/347,432

[22] Filed: Jul. 2, 1999

[51] Int. Cl.[7] .......... H01L 29/76

[52] U.S. Cl. .......... 257/411; 257/410; 257/411; 257/412; 257/760; 257/761

[58] Field of Search .......... 257/410, 411, 257/412, 760, 761

[56] References Cited

U.S. PATENT DOCUMENTS

| | | | |
|---|---|---|---|
| 3,939,047 | 2/1976 | Tsunemitsu et al. | 204/15 |
| 5,264,728 | 11/1993 | Ikeda et al. | 257/761 |
| 5,306,941 | 4/1994 | Lee et al. | 257/755 |
| 5,436,504 | 7/1995 | Chakravorty et al. | 257/758 |
| 5,506,449 | 4/1996 | Nakano et al. | 257/758 |
| 5,831,335 | 11/1998 | Miyamoto | 257/757 |
| 5,994,734 | 11/1999 | Chou | 257/316 |

FOREIGN PATENT DOCUMENTS

| | | | |
|---|---|---|---|
| 000199078 | 5/1986 | European Pat. Off. | 257/761 |
| 361100952 | 5/1986 | Japan | 257/761 |
| 402251823 | 10/1990 | Japan | 257/761 |

OTHER PUBLICATIONS

Kizilyalli, P.K., et al., "Stacked Gate Dielectrics with TaO for Future CMOS Technologies", *I.E.E.E.*, No. 22.1, pp. 216–217 (1998).

Chen, Xiaomeng et al., "Low Temperature Plasma–Assisted Chemical Vapor Deposition Of Tantalum Nitride From Tantalum Pentabromide For Copper Metallization", *J. Vac. Sci. Technol.*, No. B17(1), pp. 182–185 (Jan./Feb. 1999).

*Primary Examiner*—David Hardy
*Assistant Examiner*—Edgardo Ortiz
*Attorney, Agent, or Firm*—Wells, St. John, Roberts, Gregory & Matkin, P.S.

[57] ABSTRACT

The invention includes field effect transistors and methods of forming field effect transistors. In one implementation, a field effect transistor includes a semiconductive channel region and a gate construction operatively proximate the channel region. The gate construction includes a conductive gate region and a gate dielectric region intermediate the channel region and the conductive gate region. The gate dielectric region includes a $Ta_2O_5$ comprising layer and a $SiO_2$ comprising layer intermediate the $Ta_2O_5$ comprising layer and the channel region. The conductive gate region includes at least two different material layers, with one of the at least two layers comprising a first conductive material and another of the at least two layers comprising a conductive metal nitride which is received intermediate the $Ta_2O_5$ comprising layer and the one layer. In one implementation in a field effect transistor gate, the gate dielectric region includes a $Ta_2O_5$ comprising layer and a $SiO_2$ comprising layer intermediate the $Ta_2O_5$ comprising layer and the conductive gate region. The gate dielectric layer region is substantially void of a $SiO_2$ comprising layer intermediate the $Ta_2O_5$ comprising layer and the conductive gate region.

27 Claims, 6 Drawing Sheets

10
12
18
24
30
22
26
28
20
16
14

10
12
18
34
24
30
22
26
34
28
20
16
14

10a
12
18
34
24
30
38
26
22
34
28
20a
16
14a 10
28
12
30
24
26
22

FIELD EFFECT TRANSISTORS AND METHOD OF FORMING FIELD EFFECT TRANSISTORS

TECHNICAL FIELD

This invention relates to field effect transistors and to methods of forming field effect transistors.

BACKGROUND OF THE INVENTION

Metal Oxide Semiconductors (MOS) find use in integrated circuit devices, such as logic circuitry and memory devices. Exemplary memory include static random access memory (SRAM), dynamic random access memory (DRAM), and floating gate programmable read-only memories (i.e., PROMs, EPROMs, and EEPROMs). Such circuitry inevitably includes conductive lines connecting one or more devices together. One type of conductive line is a field effect transistor gate construction forming a portion of one or more field effect transistors. A gate is received proximate a channel region typically formed in lightly doped semiconductive material. Upon application of a suitable threshold voltage to the gate, a field is created in the channel region enabling current to flow through the channel region from a source region to a drain region. Alternately by way of example only, field effect transistor gate lines have also been utilized to establish fields therebeneath for creating isolation between circuitry components within a semiconductive substrate.

A field effect transistor gate line construction includes at least one conductive gate region and at least one gate dielectric region. The gate dielectric region is received intermediate the channel region and the conductive gate region. The common and predominantly used gate dielectric material has been $SiO_2$. Yet, continued increase in circuit density and reduction in size of the field effect transistor gate constructions have reached the point where the thickness of silicon dioxide gate dielectric layers has become so small that leakage currents, reliability and defects have become problematic. Further, it is very difficult to grow very thin adequate silicon dioxide layers, such as less than 35 Angstroms, which may be desirable for advanced process flows, for example where gate width falls to 0.12 micron or less for logic processes.

One proposed prior art alternative to these challenges would be to use a material having a higher dielectric constant than $SiO_2$. One example material is tantalum pentoxide ($Ta_2O_5$). Such material has a higher dielectric constant than silicon dioxide and silicon nitride. However, $Ta_2O_5$ apparently is problematic to use by itself in conventional constructions where the channel region and overlying conductive region of the gate comprise silicon or silicon compounds. For example, $Ta_2O_5$ does not deposit with good stoichiometry. It typically deposits as $Ta_xO_y$ which is then reoxidized to predominantly produce $Ta_2O_5$. Such processing undesirably has an adverse effect on the interface of the $Ta_2O_5$ with overlying and underlying materials. Further, it is apparently highly desirable to separate the tantalum of the $Ta_2O_5$ from contacting the typical overlying conductively doped polysilicon of the conductive gate region to prevent undesired reactions from occurring between the polysilicon and tantalum in $Ta_2O_5$. Accordingly where $Ta_2O_5$ has been suggested for use as a gate dielectric material, the proposed use is a gate dielectric region comprising a stack of $SiO_2$/$Ta_2O_5$/$SiO_2$ layers. Such a stack, however, apparently produces less than optimum effective dielectric thickness, particularly because $SiO_2$ has a lower dielectric constant than $Ta_2O_5$.

SUMMARY

The invention includes field effect transistors and methods of forming field effect transistors. In one implementation, a field effect transistor includes a semiconductive channel region and a gate construction operatively proximate the channel region. The gate construction includes a conductive gate region and a gate dielectric region intermediate the channel region and the conductive gate region. The gate dielectric region includes a $Ta_2O_5$ comprising layer and a $SiO_2$ comprising layer intermediate the $Ta_2O_5$ comprising layer and the channel region. The conductive gate region includes at least two different material layers, with one of the at least two layers comprising a first conductive material and another of the at least two layers comprising a conductive metal nitride which is received intermediate the $Ta_2O_5$ comprising layer and the one layer.

In one implementation in a field effect transistor gate construction, the gate dielectric region includes a $Ta_2O_5$ comprising layer and a $SiO_2$ comprising layer intermediate the $Ta_2O_5$ comprising layer and the channel region. The gate dielectric layer region is substantially void of a $SiO_2$ comprising layer intermediate the $Ta_2O_5$ comprising layer and the conductive gate region.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
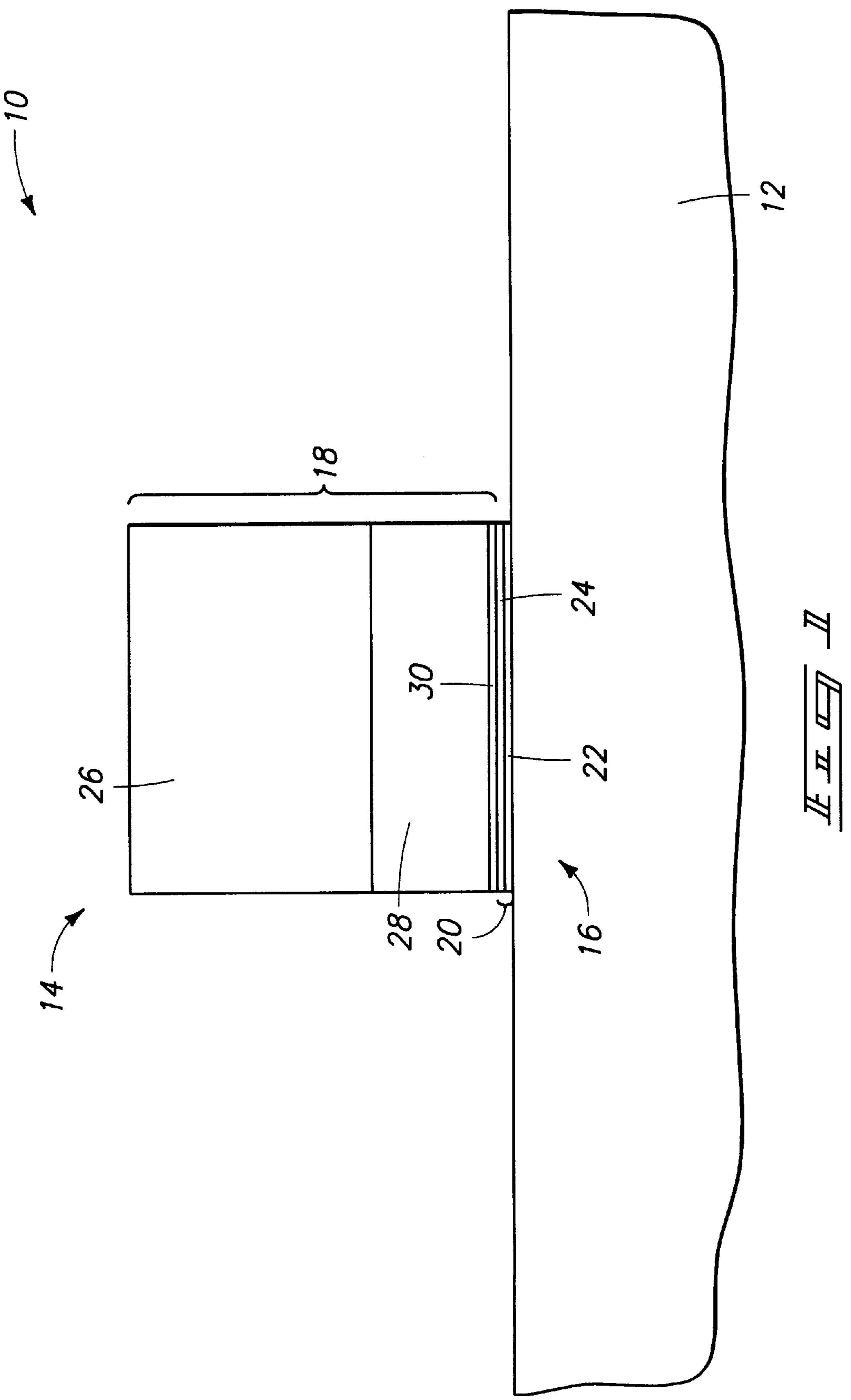
FIG. 1 is a diagrammatic fragmentary view of a semiconductor wafer fragment in accordance with the invention.

Referring to FIG. 1, a semiconductor wafer fragment in process is indicated generally with reference numeral 10, and comprises a bulk monocrystalline silicon substrate 12. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. A gate construction 14 is provided over substrate 12. A region 16 within substrate 12 beneath gate construction 14 comprises a semiconductive channel region which is selectively gateable by the application or absence of voltage applied to gate construction 14. Gate construction 14 is thereby in this example provided operatively proximate channel region 16. Source/drain regions (not shown) would typically be formed at least partially within substrate 12. Gate construction 14 would typically be ultimately surrounded with electrical insulating material, such as sidewall spacers, caps and overlying globally received insulating layers. Such are not shown or otherwise described as such are not material to the invention.

Gate construction 14 includes a gate dielectric region 20 and a conductive gate region 18. Gate dielectric region 20 is received intermediate channel region 16 and conductive gate region 18. Gate dielectric region comprises a $SiO_2$ comprising layer 22 and a $Ta_2O_5$ comprising layer 24. $SiO_2$ layer 22 is received intermediate $Ta_2O_5$ comprising layer 24 and channel region 16. $SiO_2$ comprising layer 22 can be thermally grown or deposited by conventional or to-be-developed techniques. A preferred thickness for layer 22 is no greater than about 20 Angstroms, with a preferred range being from about 5 Angstroms to about 20 Angstroms. $Ta_2O_5$ comprising layer 24 is preferably formed to a thickness of from about 25 Angstroms to about 100 Angstroms, depending upon the desired final dielectric constant. One example technique for depositing a $Ta_2O_5$ comprising layer is chemical vapor deposition, such as metal organic chemical vapor deposition. By way of example only, possible deposition conditions include a temperature from about 300° C. to about 500° C. at a pressure from about 1 Torr to about 400 Torr utilizing 100 sccm of He bubbled through liquid $Ta(OC_2H_5)_5$, 100 sccm $O_2$, and 100 sccm Ar for approximately one minute to achieve an 80 Angstroms thick deposition.

In one preferred embodiment, conductive gate region 18 comprises at least two different material layers, one of which comprises a first conductive material and another of which comprises a conductive metal nitride which is received between the $Ta_2O_5$ comprising layer and the one layer. In the illustrated FIG. 1 example, conductive gate region 18 comprises an exemplary silicide layer 26 (i.e., $WSi_x$), a conductively doped polysilicon region 28, and a conductive metal nitride region 30. Exemplary preferred thicknesses for layers 26 and 28 are 1000 Angstroms and 800 Angstroms, respectively. A preferred thickness for conductive metal nitride comprising layer 30 is from about 25 Angstroms to about 100 Angstroms. Example preferred conductive metal nitride materials include TaN, TiN, and WN. Preferred techniques for depositing such materials include chemical vapor deposition and physical vapor deposition. For example, a specific example for depositing TaN comprises reactive sputtering with a tantalum target in an $N_2$ atmosphere or chemical vapor deposition using tantalum pentabromide.

Figure 2:
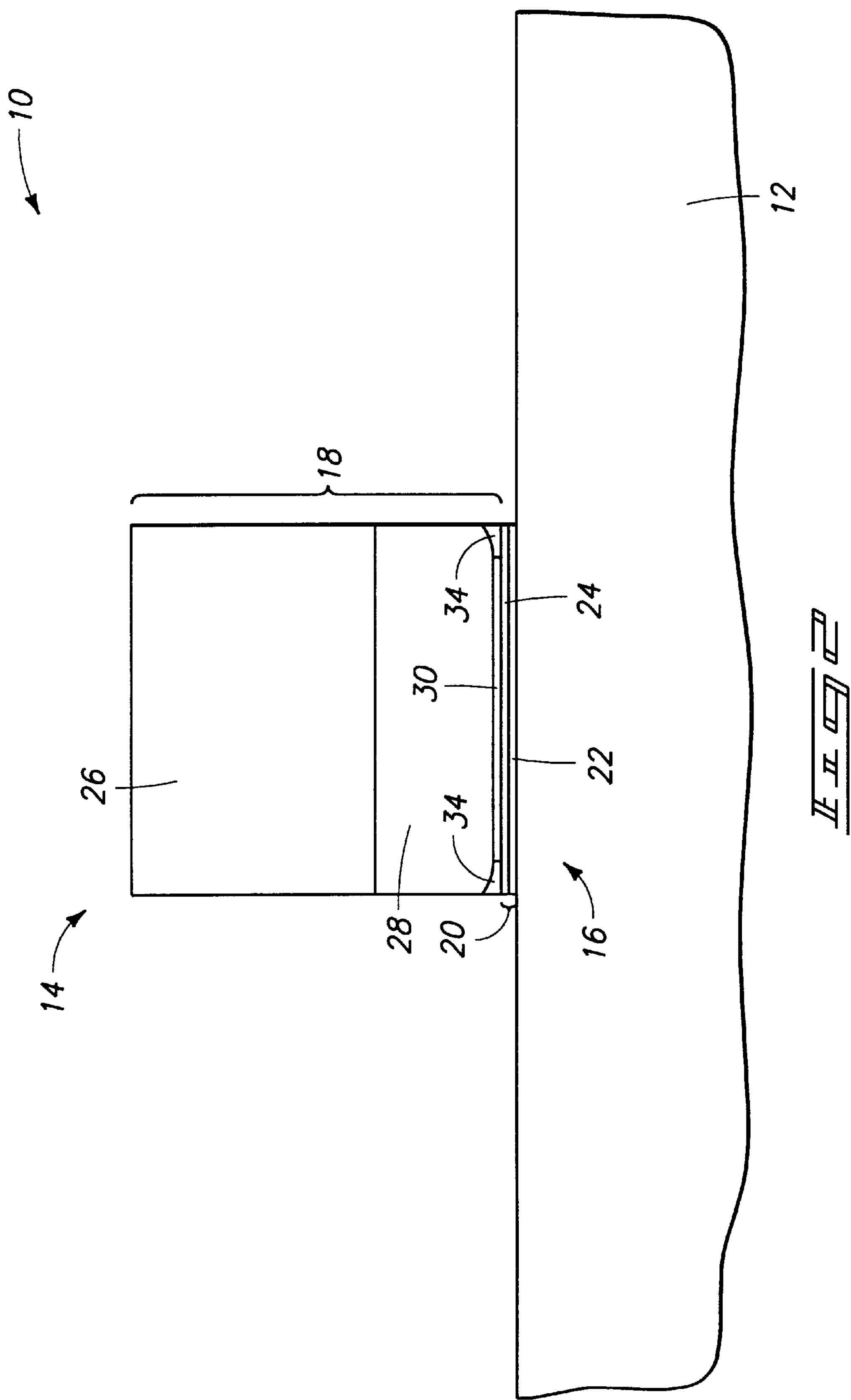
FIG. 2 is a view of the FIG. 1 wafer at a processing step subsequent to that shown by FIG. 1.

The conductive metal nitride is preferably oxidizable to a dielectric oxynitride. TaN, TiN, and WN are example materials which are so oxidizable. Referring to FIG. 2, and in accordance with a preferred aspect of the invention, laterally opposing outer regions of oxidizable nitride layer 30 are oxidized to form laterally opposed oxidized regions 34 at laterally opposed edges of gate construction 14. Such oxidation is primarily for the prior art purposes of forming a "smiling gate", and is commonly referred to as re-oxidation or re-ox in the prior art. Such oxidation is typically and preferably conducted in part to re-oxidize the source/drain regions to produce undamaged oxide thereover. Such oxidation also typically forms thermal oxide on the gate polysilicon edges (not shown). A further advantage from such re-oxidation is to reduce MOSFET gate-to-drain overlap capacitance and effectively strengthen the gate dielectric at the poly gate edge. Such benefit is obtained because oxidation-induced encroachment typically gives rise to the illustrated so-called gate birds-beak under the polysilicon edge. This reduces gate-to-drain overlap capacitance and relieves electric-field intensity at the corner of the gate structure, thus enhancing gate dielectric integrity at its edge. Reliability is also improved as resistance to hot carrier effects increases, increasing MOSFET lifetime. A specific example material for regions 34, particularly where material 30 comprises TaN, is $TaO_xN_{1-x}$ or $Ta_{2.5x}ON_{1-x}$ where "x" ranges from about 0.3 to about 1.0.

Figure 3:
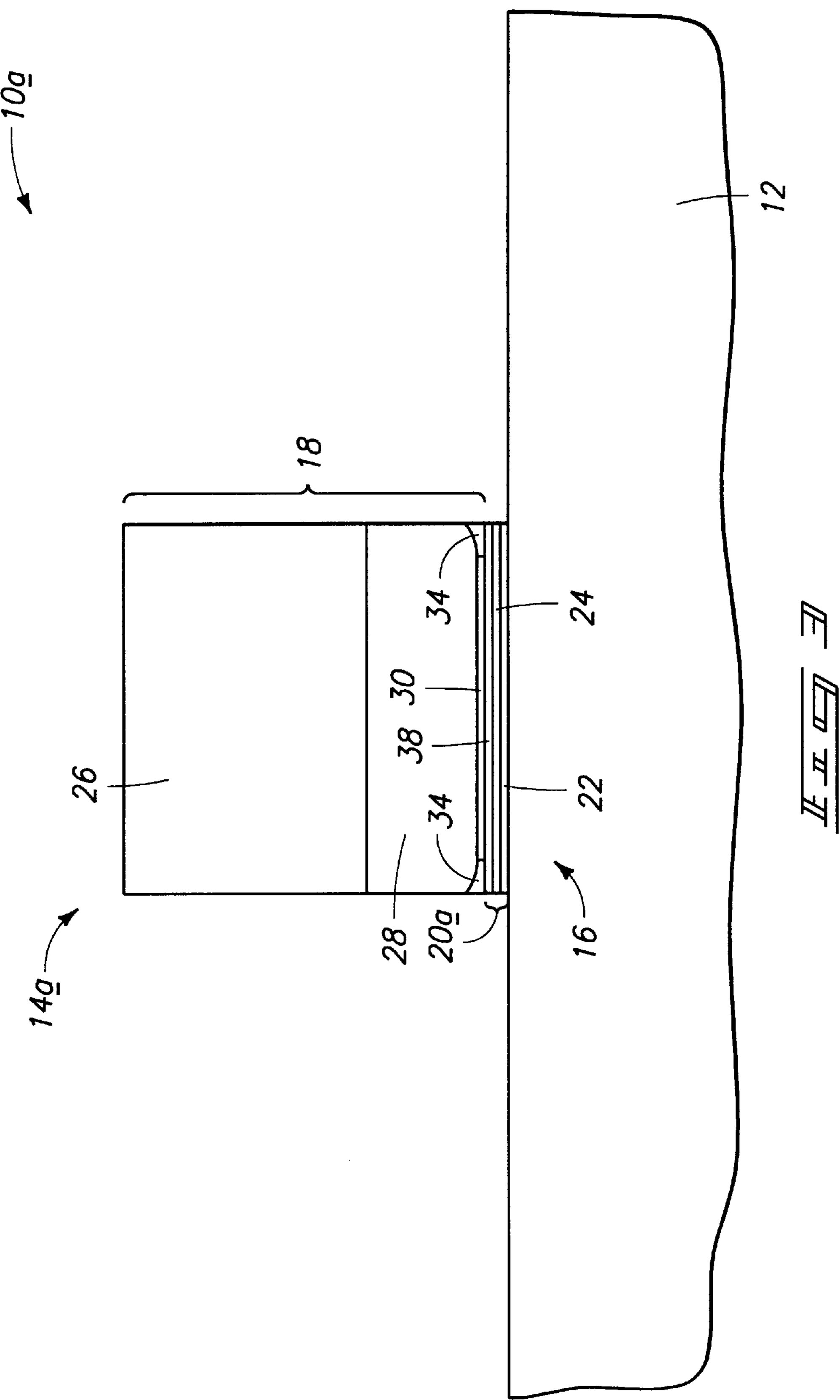
FIG. 3 is a diagrammatic fragmentary view of another semiconductor wafer fragment in accordance with the invention.

FIGS. 1 and 2 depict an example preferred embodiment wherein conductive metal nitride comprising layer 30 is formed or deposited in contact with $Ta_2O_5$ comprising layer 24. Alternately, the conductive metal nitride comprising layer can be formed to not be in contact with the $Ta_2O_5$ comprising layer, as is depicted for example in FIG. 3. Like numerals from the first described embodiment are utilized where appropriate, with differences being indicated with different numerals or with the suffix "a". Gate construction 14*a* is shown to be essentially the same as gate construction 14 in FIG. 1 but for provision of a layer 38 which prevents contact of conductive metal nitride comprising layer 30 with $Ta_2O_5$ comprising layer 24. A preferred example material for layer 38 is $Si_3N_4$. This material or other insulative or conductive materials might be desired to be utilized to provide buffering or barrier layer functions between overlying and underlying layers, and preferably without significantly adversely affecting the overall dielectric properties achieved with dielectric region 20*a*. Layer 38 is preferably no greater than about 20 Angstroms thick, and even more preferably less than about 10 Angstroms thick. Such might be formed by a rapid thermal deposition, chemical vapor deposition, nitridation, or other deposition techniques.

Figure 4:
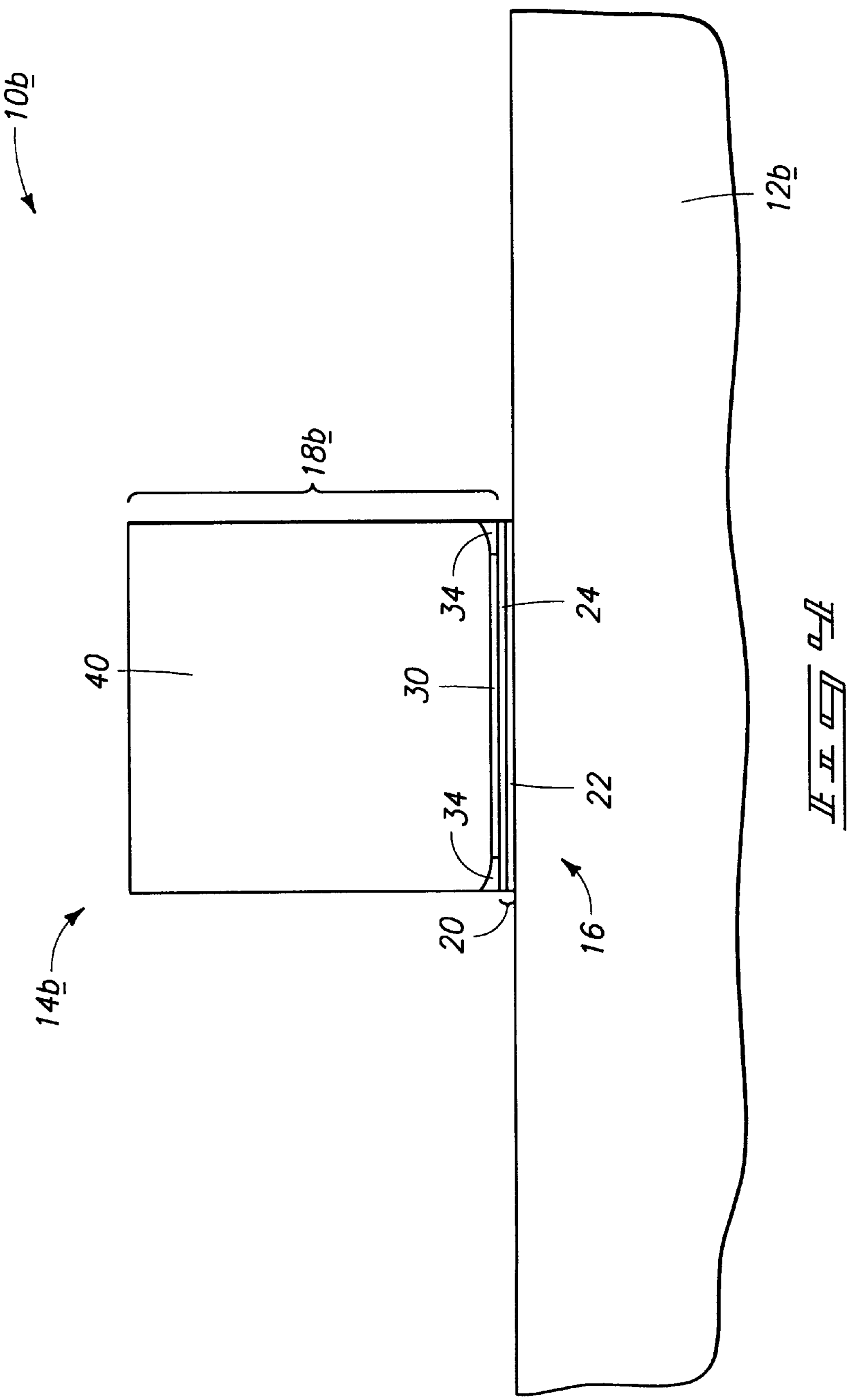
FIG. 4 is a diagrammatic fragmentary view of another semiconductor wafer fragment in accordance with the invention.

The above-described FIGS. 1 and 2 embodiment also depicts conductive gate region 18 to consist essentially of three conductive layers. FIG. 4 illustrates an exemplary alternate embodiment wherein a conductive gate region 18*b* consists essentially of only two conductive layers. With respect to FIG. 4, like numerals from the first described embodiment are utilized where appropriate, with differences being indicated with different numerals or with the suffix "b". Gate construction 14*b* in FIG. 4 depicts essentially the same construction of FIG. 1 except for a singular conductive layer 40 overlying conductive metal nitride layer 30. Such layer 40 might predominately comprise a metal present in elemental or alloy form, such as tungsten or one of its alloys. Alternately, such layer might comprise silicon present in elemental form (i.e., polycrystalline or monocrystalline silicon) or conductive compound form (i.e., a silicide such as $WSi_x$). Alternately, layer 40 might be substantially void of silicon. Further, layer 40 as well as layers 26 and 28 in the first described embodiment, may or may not also constitute a conductive metal nitride.

In the above illustrated preferred embodiments, the respective gate dielectric regions are preferably substantially void of any $SiO_2$ comprising layer intermediate the $Ta_2O_5$ comprising layer and the respective conductive gate region. Further, the invention contemplates any field effect transistor comprising a gate construction operatively received proximate a semiconductive channel region, wherein the gate dielectric region comprises a $Ta_2O_5$ comprising layer and a $SiO_2$ comprising layer intermediate the $Ta_2O_5$ comprising layer and the channel region where the gate dielectric region is substantially void of $SiO_2$ intermediate the $Ta_2O_5$ comprising layer and the conductive gate region, independent of whether a conductive metal nitride comprising layer is utilized, particularly where the overlying conductive gate region comprises silicon in elemental crystalline or compound form.

The invention is believed to have its greatest applicability where the widest portion of the conductive gate region (i.e., the transistor channel length) is less than about 0.12 micron, where $Ta_2O_5$ comprising dielectric regions will be believed to have greater applicability.

Figure 5:
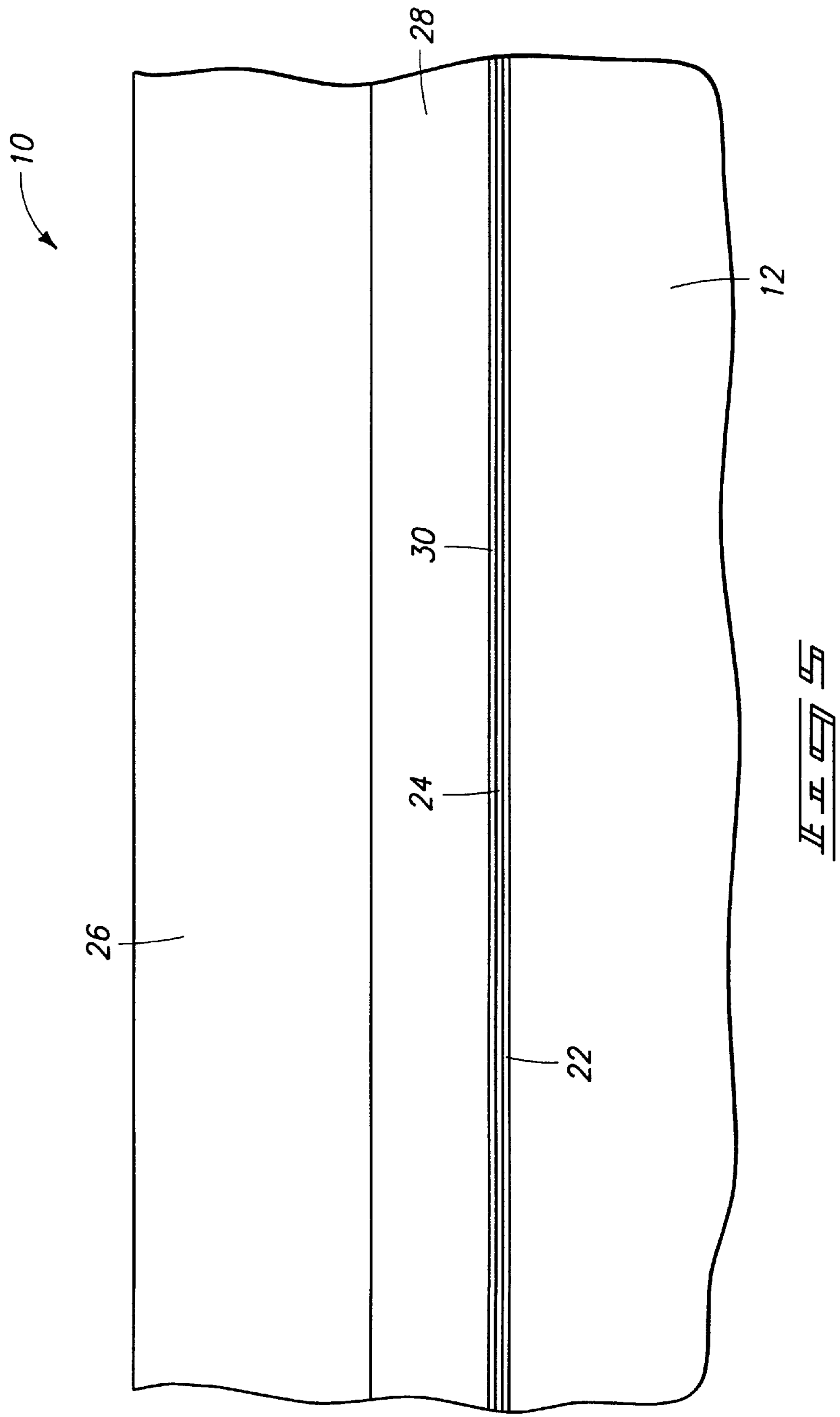
FIG. 5 is a diagrammatic fragmentary view of a semiconductor wafer fragment at a processing step in accordance with the invention
Figure 6:
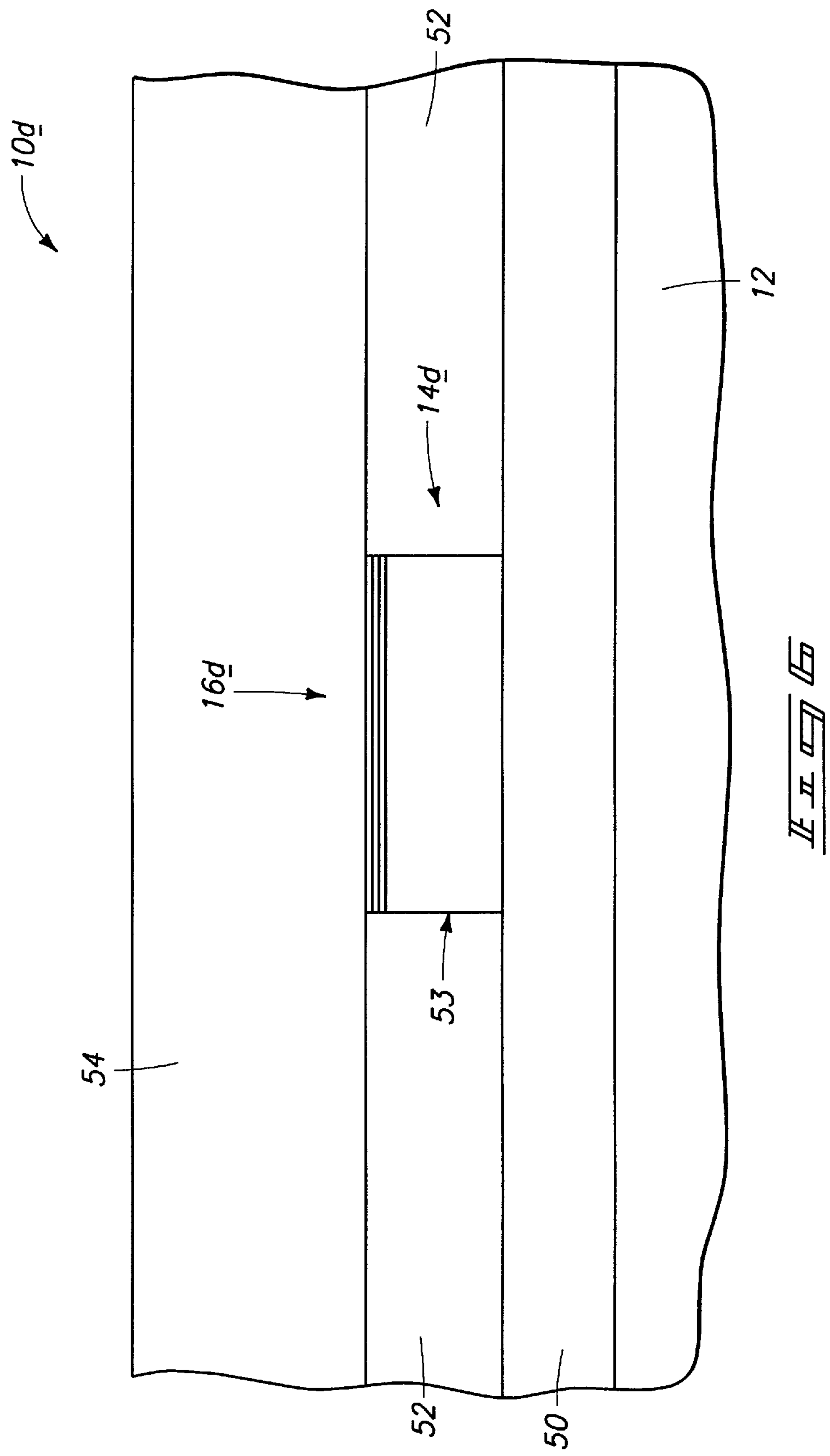
FIG. 6 is a diagrammatic fragmentary view of another semiconductor wafer fragment in accordance with the invention.

By way of example only, preferred examples of methods of forming field effect transistor gates in accordance with the invention are described with reference to FIGS. 5 and 6. Referring first to FIG. 5, a method of forming the first embodiment construction of FIG. 1 is described. Such depicts formation of the various layers of the FIG. 1 construction prior to patterning. In the processing step subsequent to that depicted by FIG. 5, patterning to produce the construction of FIG. 1 would occur. By way of example only, such patterning would preferably include photolithography utilizing photoresist.

The above-described embodiments and constructions depict formation of the conductive gate region after forming of the $SiO_2$ comprising layer and the depositing of the $Ta_2O_5$ comprising layer. Further, such processing and constructions depict formation of the $Ta_2O_5$ comprising layer after formation of the $SiO_2$ comprising layer. One alternate example construction and processing whereby the reverse essentially occurs is shown in FIG. 6. Like numerals from the first described embodiment are utilized where appropriate, with differences being indicated with different numerals or with the suffix "d". FIG. 6 illustrates a bottom gated construction whereby some insulating layer 50 is formed over substrate 12. An insulating dielectric layer 52 is subsequently deposited. In this particular depicted example, a trough-like opening 53 is formed (preferably using photolithography) within layer 52 and within which gate construction **14*d* is subsequently formed. Alternately of course, photolithographic or other patterning of a formed gate construction 14d could be conducted. Depicted FIG. 6 example illustrates an alternate example whereby patterning of the conductive gate region into a field effect transistor gate line effectively occurs prior to formation of the materials which will make up gate construction 14*d*. An overlying thin film semiconductive layer 54, such as polysilicon, is formed over gate construction 14*d*, and is effectively provided with a channel region 16*d* therein which is gateable by gate construction 14*d*.** Alternate processing and optimization are also of course contemplated.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A field effect transistor comprising:

a semiconductive channel region; and a gate construction operatively proximate the channel region, the gate construction comprising a conductive gate region and a gate dielectric region intermediate the channel region and the conductive gate region, the gate dielectric region comprising a $Ta_2O_5$ comprising layer and a $SiO_2$ comprising layer intermediate the $Ta_2O_5$ comprising layer and the channel region, the conductive gate region comprising at least two different material layers, one of the at least two layers comprising a first conductive material and another of the at least two layers comprising a conductive metal nitride which is received intermediate the $Ta_2O_5$ comprising layer and the one layer, the conductive metal nitride comprising layer having laterally opposing dielectric nitride containing regions thereagainst which are thicker than the conductive metal nitride comprising layer.

2. The field effect transistor of claim 1 wherein the conductive metal nitride comprising layer is in contact with the $Ta_2O_5$ comprising layer.

3. The field effect transistor of claim 1 wherein the conductive metal nitride comprising layer is not in contact with the $Ta_2O_5$ comprising layer.

4. The field effect transistor of claim 1 wherein the gate dielectric region comprises a $Si_3N_4$ comprising layer which is received intermediate the $Ta_2O_5$ comprising layer and the conductive metal nitride comprising layer.

5. The field effect transistor of claim 1 wherein the first conductive material comprises silicon.

6. The field effect transistor of claim 5 wherein the silicon is predominately present as a conductive compound.

7. The field effect transistor of claim 1 wherein the first conductive material comprises a metal present in elemental or alloy form.

8. The field effect transistor of claim 1 wherein the conductive gate region consists essentially of only said two layers.

9. The field effect transistor of claim 1 wherein the conductive gate region consists essentially of three conductive layers.

10. The field effect transistor of claim 1 wherein the conductive metal nitride comprises TaN.

11. The field effect transistor of claim 1 wherein the conductive metal nitride comprises TiN.

12. The field effect transistor of claim 1 wherein the conductive metal nitride comprises WN.

13. The field effect transistor of claim 1 wherein the first conductive material is not a conductive metal nitride.

14. The field effect transistor of claim 1 wherein the conductive metal nitride is oxidizable to a dielectric nitride, and further comprising laterally opposing oxidized regions of said oxidizable nitride received against the conductive metal nitride comprising layer.

15. The field effect transistor of claim 1 wherein the conductive metal nitride comprising layer is from about 25 Angstroms to about 100 Angstroms thick.

16. The field effect transistor of claim 1 wherein the conductive metal nitride comprising layer is from about 25 Angstroms to about 100 Angstroms thick, and the $Ta_2O_5$ comprising layer is from about 25 Angstroms to about 100 Angstroms thick.

17. The field effect transistor of claim 1 wherein a widest portion of the conductive gate region is no greater than about 0.12 micron wide, the $SiO_2$ comprising layer is no greater than about 20 Angstroms thick, the conductive metal nitride comprising layer is from about 25 Angstroms to about 100 Angstroms thick, and the $Ta_2O_5$ comprising layer is from about 25 Angstroms to about 100 Angstroms thick.

18. A field effect transistor comprising:

a semiconductive channel region; and a gate construction operatively proximate the channel region, the gate comprising a conductive gate region and a gate dielectric region intermediate the channel region and the conductive gate region, the gate dielectric region comprising a $Ta_2O_5$ comprising layer from about 25 Angstroms to about 100 Angstroms thick and a $SiO_2$ comprising layer less than or equal to about 20 Angstroms thick intermediate the $Ta_2O_5$ comprising layer and the channel region, the conductive gate region comprising at least two different material layers, one of the at least two layers comprising a first conductive material and another of the at least two layers comprising TaN which is received intermediate the $Ta_2O_5$ comprising layer and the one layer, the TaN comprising layer being from about 25 Angstroms and 100 Angstroms thick, the TaN comprising layer having laterally opposing $TaO_xN_{1-x}$ regions thereagainst which are thicker than the TaN comprising layer.

19. The field effect transistor of claim 18 wherein the TaN comprising layer is in contact with the $Ta_2O_5$ comprising layer.

20. The field effect transistor of claim 18 wherein the TaN comprising layer is not in contact with the $Ta_2O_5$ comprising layer.

21. The field effect transistor of claim 18 wherein the gate dielectric region is substantially void of any $SiO_2$ comprising layer intermediate the $Ta_2O_5$ comprising layer and the conductive gate region.

22. The field effect transistor of claim 18 wherein the TaN comprising layer is from about 25 Angstroms to about 100 Angstroms thick.

23. The field effect transistor of claim 18 wherein a widest portion of the conductive gate region is no greater than about 0.12 micron wide, the $SiO_2$ comprising layer is no greater than about 20 Angstroms thick, the TaN comprising layer is from about 25 Angstroms to about 100 Angstroms thick, and the $Ta_2O_5$ comprising layer is from about 25 Angstroms to about 100 Angstroms thick.

24. A field effect transistor comprising:

a semiconductive channel region; and a gate construction operatively proximate the channel region, the gate comprising a conductive gate region and a gate dielectric region intermediate the channel region and the conductive gate region, the gate dielectric region comprising a $Ta_2O_5$ comprising layer and a $SiO_2$ comprising layer intermediate the $Ta_2O_5$ comprising layer and the channel region, the gate dielectric layer region being substantially void of a $SiO_2$ comprising layer intermediate the $Ta_2O_5$ comprising layer and the conductive gate region, wherein the conductive gate region comprises a conductive metal nitride comprising layer having laterally opposing dielectric nitride containing regions thereagainst which are thicker than the conductive metal nitride comprising layer.

25. The field effect transistor of claim 24 wherein the conductive gate region comprises doped silicon present in elemental crystalline form.

26. The field effect transistor of claim 24 wherein the conductive gate region comprises a conductive silicon compound.

27. The field effect transistor of claim 24 wherein the gate dielectric region comprises a $Si_3N_4$ comprising layer intermediate the $Ta_2O_5$ comprising layer and the conductive gate region.

* * * * *